United States Patent
Suehiro et al.

(10) Patent No.: US 7,290,902 B2
(45) Date of Patent: Nov. 6, 2007

(54) DIRECT-TYPE BACKLIGHT

(75) Inventors: Ichiro Suehiro, Osaka (JP); Yuji Hotta, Osaka (JP); Naoki Sadayori, Osaka (JP); Noriaki Harada, Osaka (JP); Kazuki Uawada, Osaka (JP)

(73) Assignee: Nitto Denko Corporation, Osaka (JP)

( * ) Notice: Subject to any disclaimer, the term of this patent is extended or adjusted under 35 U.S.C. 154(b) by 72 days.

(21) Appl. No.: 11/105,397

(22) Filed: Apr. 14, 2005

(65) Prior Publication Data

US 2005/0237765 A1    Oct. 27, 2005

(30) Foreign Application Priority Data

Apr. 21, 2004  (JP) .......................... P.2004-126077

(51) Int. Cl.
    *F21V 7/00*  (2006.01)
(52) U.S. Cl. .................. 362/347; 362/257; 362/267; 362/296; 362/800; 362/329; 362/339; 362/347
(58) Field of Classification Search ................ 362/615; 313/110, 111, 501, 512
See application file for complete search history.

(56) References Cited

U.S. PATENT DOCUMENTS

| | | | |
|---|---|---|---|
| 5,300,169 A | * | 4/1994 | Tahara ........................ 156/230 |
| 5,770,306 A | * | 6/1998 | Suzuki et al. ................ 428/328 |
| 6,290,364 B1 | * | 9/2001 | Koike et al. ................. 362/620 |
| 6,603,520 B2 | * | 8/2003 | Umemoto et al. ............ 349/65 |
| 6,777,719 B1 | * | 8/2004 | Fujii ............................ 257/99 |
| 6,873,092 B2 | * | 3/2005 | Tomoda et al. ............. 313/112 |
| 6,890,800 B2 | * | 5/2005 | Takehara et al. ............ 438/126 |
| 2003/0090888 A1 | * | 5/2003 | Mizutani et al. .............. 362/31 |
| 2003/0151361 A1 | * | 8/2003 | Ishizaka ..................... 313/512 |
| 2004/0065886 A1 | * | 4/2004 | Eliashevich et al. .......... 257/79 |

FOREIGN PATENT DOCUMENTS

JP    2000-184137 A    6/2000

* cited by examiner

*Primary Examiner*—Sandra O'Shea
*Assistant Examiner*—Kristen A Manskar
(74) *Attorney, Agent, or Firm*—Sughrue Mion Pllc.

(57) ABSTRACT

The present invention provides A direct-type backlight having: a resin sealing member including at least one resin layer, which has a light reflecting section formed on the outermost surface of the resin sealing member; an optical semiconductor element sealed by the resin sealing member; and plural circular light scattering grooves formed concentrically on at least one surface of the resin layer, wherein an area of a circle in the center and an area among the respective concentric circles are substantially the same.

13 Claims, 5 Drawing Sheets

X-X' CROSS SECTION

DIRECT-TYPE BACKLIGHT

FIELD OF THE INVENTION

The present invention relates to a direct-type backlight that is used in a liquid crystal display.

BACKGROUND OF THE INVENTION

A planar light source device using an optical semiconductor element (an LED), in which a large number of grooves having a shape of a semicircle on cross section are formed concentrically in order to scatter light, is reported (see, for example, reference 1).

[Reference 1] JP 2000-184137 A

However, in the planar light source device described above, sufficient uniformity of light emission in a plane has not been obtained yet.

It is an object of the present invention to provide a direct-type backlight that has a more uniform amount of light emission in a plane.

SUMMARY OF THE INVENTION

The present inventors have made eager investigation to examine the problem. As a result, it has been found that the foregoing objects can be achieved by the following direct-type backlight and lighting device. With this finding, the present invention is accomplished.

The present invention is mainly directed to the following items:

(1) A direct-type backlight comprising: a resin sealing member comprising at least one resin layer, which has a light reflecting section formed on the outermost surface of the resin sealing member; an optical semiconductor element sealed by the resin sealing member; and plural circular light scattering grooves formed concentrically on at least one surface of the resin layer, wherein an area of a circle in the center and an area among the respective concentric circles are substantially the same.

(2) The direct-type backlight according to item 1, wherein a sectional shape of at least one of the light scattering grooves is a triangle.

(3) The direct-type backlight according to item 2, wherein the triangle is a right triangle.

(4) The direct-type backlight according to item 1, wherein a width of each of the light scattering grooves is 1 to 100 µm.

(5) The direct-type backlight according to item 1, wherein a depth of each of the light scattering grooves is 0.5 to 120 µm.

(6) The direct-type backlight according to item 1, wherein the resin sealing member has a thickness of from 0.1 to 1 mm.

(7) The direct-type backlight according to item 1, wherein the sealing member has a reflective surface disposed on a side surface thereof.

(8) The direct-type backlight according to item 1, wherein the light reflecting section is formed so as to locate in a position right above the optical semiconductor element.

(9) The direct-type backlight according to item 1, wherein the light reflecting section comprises fine unevenness.

(10) The direct-type backlight according to item 1, wherein a metal thin film is disposed on the light reflecting section.

(11) The direct-type backlight according to item 1, wherein the at least one resin layer includes plural resin layers, wherein each of the plural resin layers has different refractive indices.

(12) The direct-type backlight according to item 11, wherein the plural resin layers comprises the outermost layer and the innermost layer that the optical semiconductor element is disposed on, wherein the plural resin layers are arranged in such a manner that a refractive index of each of the plural resin layers decrease sequentially from the innermost layer to the outermost layer.

(13) A lighting device comprising a direct-type backlight according to item 1 and a circuit board.

DETAILED DESCRIPTION OF THE INVENTION

In the present invention, an optical semiconductor element is sealed by a sealing member comprising a resin (hereinafter referred to as "resin sealing member"), which comprises at least one resin layer, a light reflecting section disposed on the outermost surface of the resin sealing member, which is opposite to a surface that the optical semiconductor element is disposed, and light scattering grooves formed regularly on at least one surface of the resin layer.

Thereby, light emitted from the optical semiconductor element is reflected and scattered into the resin sealing member by the light reflecting section and or the light scattering grooves, further reflected by the lower surface of the resin sealing member, and emitted through the upper surface of the resin sealing member efficiently and uniformly.

In the present invention, the "upper surface" of the resin sealing member and the resin layers refers to a surface on an opposite side of a side that the optical semiconductor element is disposed, and the "lower surface" refers to a surface that the optical semiconductor element is disposed.

Figure 1A:
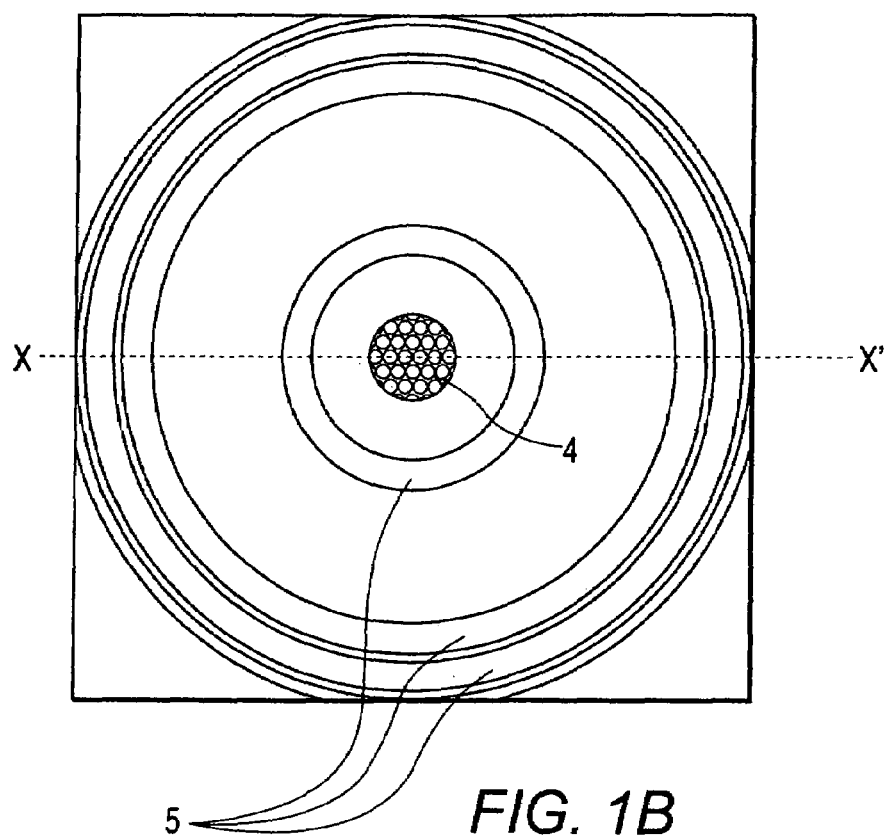
FIGS. 1A and 1B are plan view and a sectional view, respectively, of an embodiment of a direct-type backlight of the present invention.
Figure 1B:
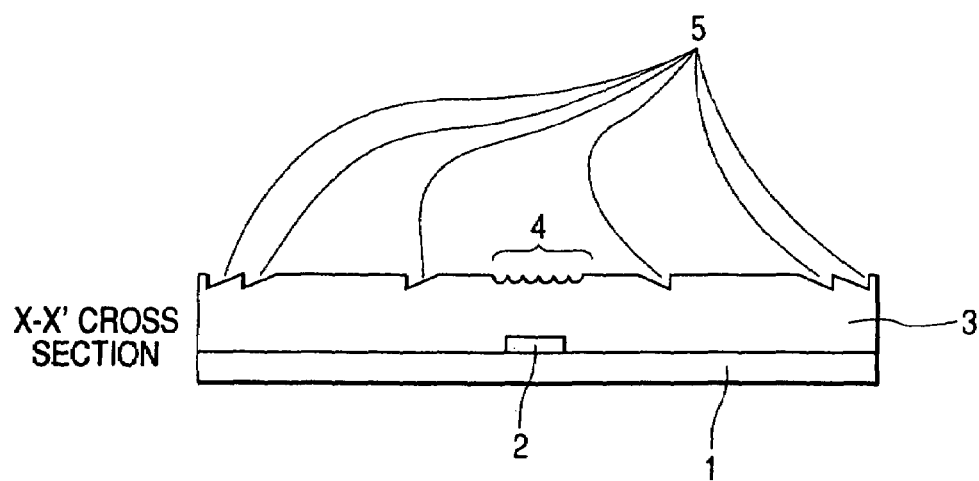

An embodiment of a direct-type backlight of the present invention is shown in FIG. 1.

In FIG. 1, an optical semiconductor element 2 is mounted on a wiring circuit board 1 and sealed by a resin sealing member 3. A light reflecting section 4 and light scattering grooves 5 are formed on an upper surface of the resin sealing member 3.

Examples of the wiring circuit board 1 used in the present invention include a glass epoxy board, a polyimide board, and an epoxy resin board. From the viewpoint of facilitating reflection of light, a white wiring circuit board filled with a filler of titanium oxide or the like is preferable. In order to further facilitate reflection of light, it is preferable that a reflection layer such as a layer of a thermosetting resin or a light-curing resin, which has a filler such as titanium oxide, zirconium oxide or silicon oxide is dispersed in, or a metal evaporation layer is disposed on a surface of the wiring circuit board.

Examples of the optical semiconductor element 2 used in the present invention include a face-up optical semiconductor element in which an electrode is set on a light-emitting surface and a flip chip optical semiconductor element that is directly mounted on a wiring circuit board. In general, a shape of the optical semiconductor element 2 is a square. As such an optical semiconductor element, for example, a commercially available optical semiconductor element may be used.

Examples of a method of mounting an optical semiconductor element on a wiring circuit board include a face-up mounting method that is suitable for mounting an optical semiconductor element with an electrode arranged on a light-emitting surface and a flip chip mounting method that is suitable for mounting an optical semiconductor element with an electrode arranged on a surface opposite to a light-emitting surface. In mounting an optical semiconductor element on a wiring circuit board, only a single color optical semiconductor element may be mounted or red, green, and blue optical semiconductor elements may be mounted side by side according to circumstances in order to obtain white light.

The resin sealing member 3 for sealing the optical semiconductor element 2 comprises a single or plural resin layers consisting of a material such as epoxy resin, acrylic resin, urethane resin or polycarbodiimide resin. A white fluorescent agent may be contained in the respective resin layers in order to make light to be emitted from the direct-type backlight white. A shape of the resin sealing member is not specifically limited but is preferably a square. When the shape is a square, a length of one side of the square is preferably 30 to 100 mm. A thickness of the resin sealing member is preferably 0.1 to 1 mm. In order to prevent reflected and scattered light from exiting to the outside through a side surface of the resin sealing member, it is preferable that the side surface has a reflective surface obtained by, e.g., a treatment such as metal evaporation. In the case of the resin sealing member comprises plural resin layers, from the viewpoint of improvement of light extracting efficiency, it is preferable that each of the plural resin layers has different refractive indices. Furthermore, it is more preferable that the plural resin layers are arranged in such a manner that a refractive index of each of the plural resin layers decrease sequentially from the innermost layer to the outermost layer, provided that the plural resin layers comprises the outermost layer and the innermost layer that the optical semiconductor element is disposed on.

Figure 7:
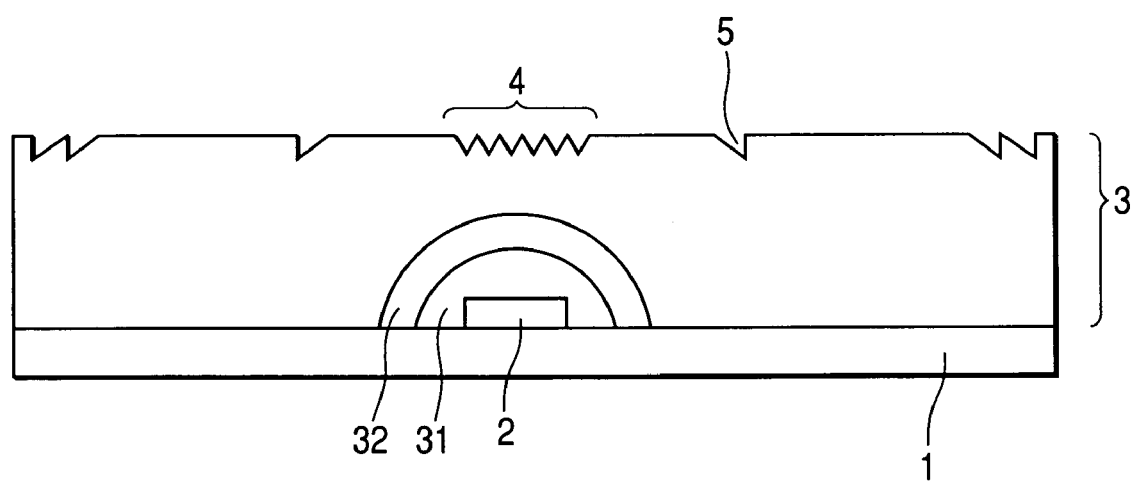
FIG. 7 is a sectional view of other embodiment of a direct-type backlight of the presention invention.

Examples of a method of sealing the optical semiconductor element 2 with a single resin layer include transfer molding, casting, and a laminate method of heating and pressing resin machined into a sheet shape in advance. Among these methods, the laminate method is preferable because resin can be molded easily at low cost. Examples of a method of sealing the optical semiconductor element 2 with plural resin layers include transfer molding for each layer, casting for each layer, a laminate method of heating and pressing each resin layer machined into a sheet shape in advance, and a laminate method of heating and pressing plural resin layers after machining the plural resin layers into a sheet shape collectively in advance. In the case of the resin sealing member 3 includes two resin layers, from the viewpoint of improvement of light extracting efficiency, it is preferable that in the innermost layer 31, which is a layer closest to an optical semiconductor element 2, has a domy shape so as to surround and seal the optical semiconductor element 2 as shown in FIG. 7. In the case of the resin sealing member 3 includes plural resin layers, it is preferable that the layers having a domy shape, e.g., layer 32, are laminated sequentially on the innermost layer 31 as shown in FIG. 7. It is also preferable that the resin sealing member has a circular hole having a size larger than the optical semiconductor element, which is formed in a portion corresponding to the position of the optical semiconductor element.

In the present invention, the "light reflecting section" refers to a section that has a function of blocking light directly emitted from an optical semiconductor element to the outside, reflecting the light, and scattering the light into a resin sealing member. From the view point of showing such a function efficiently, it is preferable that the light reflecting section is formed so as to locate in a position right above the optical semiconductor element.

In order to provide the light reflecting section 4 showing the function, a large number of fine unevenness are formed in the light reflecting section 4. A shape of the unevenness is not specifically limited as long as the function is shown. However, examples of the shape include a semispherical shape, a pyramid shape, and a random shape without regularity. A size the unevenness is not specifically limited. However, for example, in the case of the semicircular shape, a curvature radius is preferably 1 to 50 μm, an height is preferably 1 to 50 μm and more preferably 15 to 30 μm.

A shape and a size of the light reflecting section are not specifically limited as long as the function is shown and the advantage of the present invention is realized. However, the shape is preferably a circular shape and the size is preferably a size allowing the light reflecting section to be arranged further on an inner side than a groove closest to the center among the light scattering grooves.

It is possible to form the unevenness using a mold having unevenness of a pattern opposite to the unevenness of the light reflecting section on a surface thereof at the time of the resin sealing. For example, in the case of the transfer molding, the unevenness are formed by a transfer mold with the unevenness formed in a section corresponding to an upper surface of the resin sealing member. In the case of the casting, the unevenness are formed by pressing a surface of a resin layer formed by the casting using a press plate with the unevenness formed on a surface thereof. In the case of the laminate method, the unevenness are formed by pressing resin using a press plate with the unevenness formed on a surface thereof at the time of lamination.

As manufacturing of the mold, for example, a polyimide sheet is machined into a predetermined unevenness shape by laser machining and a nickel thin film is formed by electroless nickel plating to make a surface of the polyimide sheet smooth. Subsequently, the nickel thin film is transferred to the transfer mold and the press plate, whereby a mold for machining the unevenness in the light reflecting section is manufactured.

From the viewpoint of facilitating blocking and reflection of light directly emitted from the optical semiconductor element to the outside, it is preferable that a metal thin film is disposed on an upper surface of the light reflecting section. Examples of metal of the metal thin film include silver and aluminum. It is possible to form the metal thin film on the upper surface of the light reflecting section by, for example, masking and sputtering sections other than the light reflecting section. Note that, in the case of the resin sealing is performed by the transfer molding, since the unevenness are formed simultaneously with the molding, the formation of the metal thin film is performed after the formation of the unevenness. On the other hand, in the case of the resin sealing is performed by the casting or the laminate method, the formation of the metal thin film may be performed before or after the unevenness are formed by the press plate. A thickness of the metal thin film is preferably 0.05 to 0.5 μm.

In the present invention, the "light scattering grooves" refers to a section having a function of reflecting light emitted from the optical semiconductor element and scattering the light into the resin sealing member or on an upper surface of the resin sealing member.

Figure 8A:
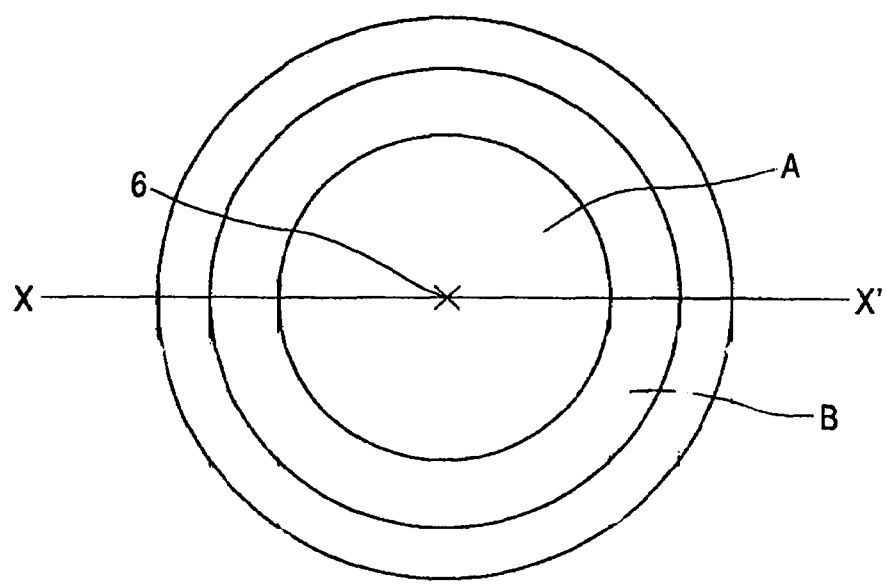
FIGS. 8A and 8B are a plan view and a sectional view, respectively, of an embodiment of a direct-type backlight of the present invention.
Figure 8B:
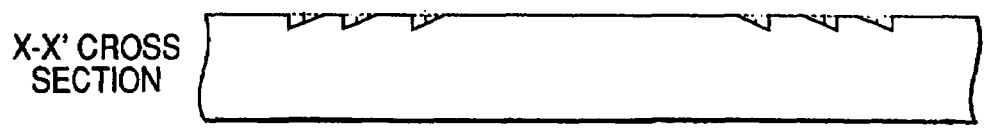

In the present invention, plural light scattering grooves 5 are formed in a circular shape concentrically on at least one surface of at least one resin layer constituting the resin sealing member, and are arranged in such a manner that both of an area of a circle in the center and an area among the respective concentric circles are substantially the same, as illustrated, for example, in FIGS. 8A and 8B. Here, the description "areas are substantially the same" means that the areas different from each other slightly are treated as "the same" areas as long as the advantage of the present invention is realized. For example, areas with a difference within a range of ±5% are treated as "areas that are substantially the same". The difference is preferably within a range of ±3%, more preferably within a range of ±1%. Moreover, when the direct-type backlight of the present invention is viewed from a surface on which light emission is observed, the circular light scattering grooves 5 are preferably formed so as to surround the light reflecting section 4.

From the viewpoint of easiness of formation, it is preferable that the light scattering grooves are formed on an upper surface of the at least one resin layer. The center of the concentric circles is preferably in a position corresponding to a position of the optical semiconductor element on the wiring circuit board, and more preferably in a position corresponding to a center of gravity of the optical semiconductor element.

Figure 2A:
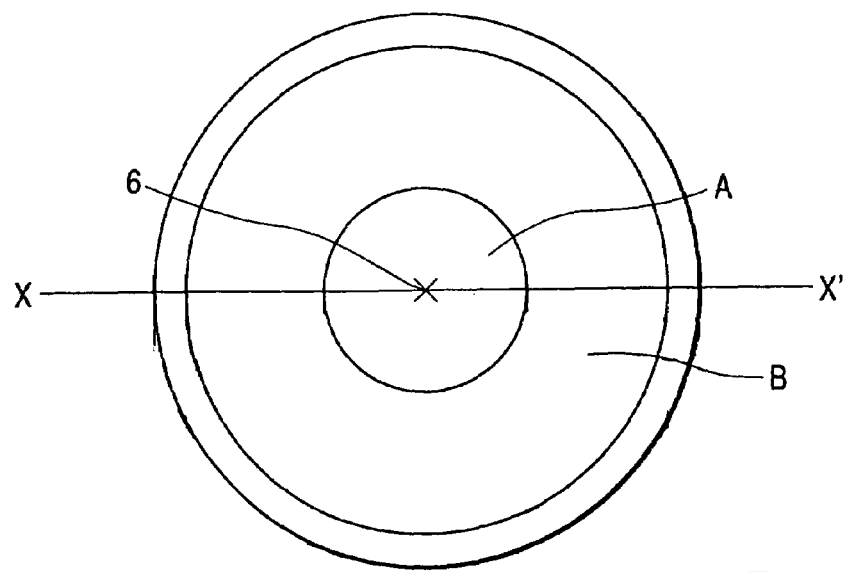
FIGS. 2A and 2B are a plan view and a sectional view, respectively, of a shape of light scattering grooves used in the present invention.
Figure 2B:
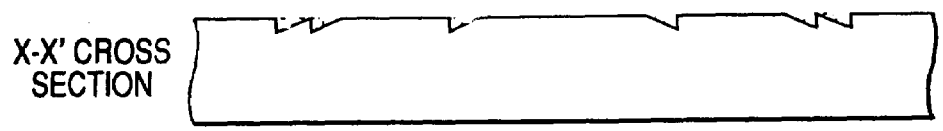

In the present invention, as shown in FIG. 2, the "area of a circle in the center" refers to an area (A) of a circle having a radius of a distance from a center 6 of a circle to a center of a width of a groove closest to the center among the light scattering grooves. The "area among the respective concentric circles" refers to an area (B) calculated as a difference of areas of respective concentric circles adjacent to each other. The "area of the respective concentric circles" refers to an area of a circle having a distance from a center of the circle to a center of a width of a light scattering groove as a radius. From the viewpoint of obtaining waveguide for light effectively, the area is preferably 1.6 to 85 mm$^2$ and more preferably 2.5 to 11 mm$^2$.

Figure 3:
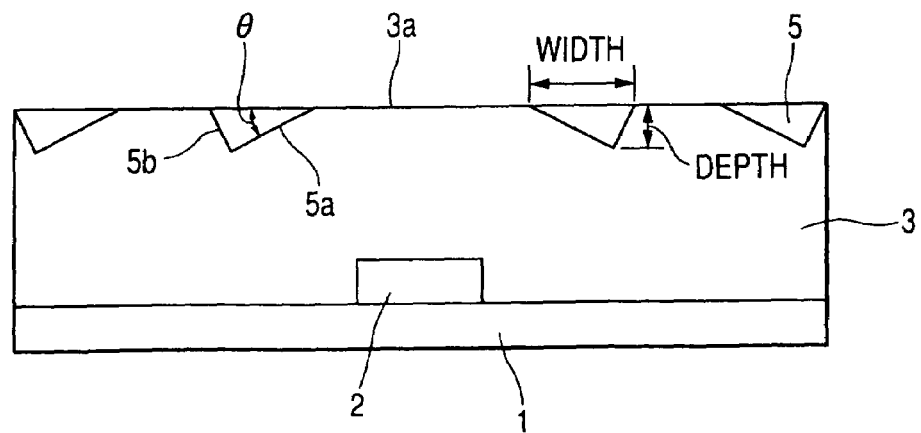
FIG. 3 is a sectional view of the light scattering grooves used in the present invention.

As a sectional shape of the light scattering grooves, a polygon such as a triangle or a square, a semicircle, a semiellipse are preferable, and a triangle is more preferable. The sectional shape does not have to be the same in all the light emitting grooves as long as the advantage of the present invention is realized. In the case of the sectional shape is a triangle, as shown in FIG. 3, the light scattering groove 5 comprises a surface 5a that is in a position near the center 6 of the circle and a surface 5b that is in a position away from the center 6 in a cross-sectionl surface perpendicular to the circumferential direction of the groove. An angle θ defined by a surface 3a of a resin layer, in which the light scattering grooves is disposed, and the surface 5a is preferably 20 to 50 degrees, more preferably 30 to 45 degrees. In the case of the sectional shape is a triangle, the triangle is preferably a right triangle, more preferably a right triangle such that the surface 5a corresponds a hypotenuse of the right triangle.

The number of light scattering grooves formed on one surface of one resin layer is preferably 50 to 700, more preferably 200 to 500. From the viewpoint of improvement of light extraction efficiency and securing of uniformity of a light emission intensity in a plane, a width of the light scattering grooves is preferably 1 to 100 μm, more preferably 20 to 70 μm, and still more preferably 20 to 50 μm. A depth of the light scattering grooves is preferably 0.5 to 120 μm and more preferably 10 to 30 μm.

It is possible to form the light scattering grooves with a method that is the same as the method of forming the light reflecting section. It is also possible to manufacture the mold for forming the light scattering grooves with a method that is the same as the method of forming the mold for forming the light reflecting section.

EXAMPLES

The present invention is now illustrated in greater detail with reference to Examples and Comparative Examples, but it should be understood that the present invention is not to be construed as being limited thereto.

Manufacturing Example 1

Mounting an Optical Semiconductor Element on a Wiring Circuit Board

A white board with a predetermined wiring pattern formed thereon (manufactured by Risho Kogyo Co., Ltd; CS-3965, length 30 mm×width 30 mm×thickness 600 μm) was prepared as a wiring circuit board and an optical semiconductor element (manufactured by Showa Denko K. K.; SOA-230U) was mounted on the white board by wire bonding to prepare a wiring circuit board with the optical semiconductor element mounted thereon.

Manufacturing Example 2

Manufacturing Press Plate A

A light reflecting section and light scattering grooves having shapes shown below were formed on a polyimide sheet by laser machining, and a nickel thin film was formed by nickel plating to make a machined surface thereof smooth. Press plate A was prepared by transferring the obtained nickel thin film.

Shape of the Light Reflecting Section

An unevenness of a semispherical shape with a radius of 20 μm, a height of 25 μm, and a pitch of 60 μm in a circle having a radius of 1 mm with a position corresponding to a center of gravity of an optical semiconductor element as a center Shape of the Light Scattering Grooves An area of a circle in the center: 7.1 mm² (radius of about 1.5 mm)
The number of concentric circles: 200
An area among respective concentric circles: 7.1 mm² (a radius of an outermost circle of about 21.2 mm)
A shape of grooves: width of 30 μm, depth of 17 μm, a sectional shape of a right triangle (θ of 30 degrees, the hypotenuse of the right triangle corresponds to the surface 5a)

Manufacturing Example 3

Manufacturing Press Plate B

A light reflecting section having a shape shown below was formed on a polyimide sheet by laser machining and a nickel thin film was formed by nickel plating to make a machined surface thereof smooth. Press plate B was manufactured by transferring the obtained nickel thin film.

Shape of the Light Reflecting Section

An unevenness of a semispherical shape with a radius of 20 μm, a height of 25 μm, and a pitch of 60 μm in a circle having a radius of 1 mm with a position corresponding to a center of gravity of an optical semiconductor element as a center Manufacturing Example 4

Manufacturing Press Plate C

A projection having a shape shown below was formed on a polyimide sheet by laser machining and a nickel thin film was formed by nickel plating to make a machined surface thereof smooth. Press plate C was prepared by transferring the obtained nickel thin film.

Shape of the Light Scattering Grooves

An area of a circle in the center: 7.1 mm² (radius of about 1.5 mm)
The number of concentric circles: 200
An area among respective concentric circles: 7.1 mm² (a radius of an outermost circle of about 21.2 mm)
A shape of the projection: width of 30 μm, depth of 17 μm, a sectional shape of a right triangle (θ of 30 degrees, the hypotenuse of the right triangle corresponds to the surface 5a)

Manufacturing Example 5

Manufacturing an Epoxy Resin Layer

An epoxy resin tablet for sealing an optical semiconductor element (manufactured by Nitto Denko Corporation; NT-300S) was dissolved in methyl ethyl ketone at 30 wt % and an obtained solution was applied on a separator (having a thickness of 50 μm) (manufactured by Toray Industries, Inc.) of a polyethylene terephthalate film treated by a release agent (silicone fluoride). The solution was dried at 120° C. for one minute and further dried at 100° C. for one minute to manufacture a preliminarily cured sheet-like epoxy resin layer (length 30 mm×width 30 mm, thickness 20 μm).

Manufacturing Example 6

Manufacturing a Polycarbodiimide Resin Layer 29.89 g (171.6 mmol) of Tolylene diisocyanate (an isomer mixture: manufactured by Mitsui Takeda Chemicals, Inc.; T-80), 94.48 g (377.52 mmol) of 4,4'-diphenylmethane diisocyanate, 64.92 g (308.88 mmol) of naphthalene diisocyanate, and 184.59 g of toluene were poured into a four-neck flask having a capacity of 500 mL attached with an agitator, a dropping funnel, a reflux condenser, and a thermometer and mixed.

8.71 g (51.48 mmol) of 1-naphthyl isocyanate and 0.82 g (4.29 mmol) of 3-methyl-1-phenyl-2-phosphorene-2-oxide were further added, heated to 100° C. while being agitated, and kept at the temperature for two hours.

Progress of reaction was confirmed by IR measurement. More specifically, a decrease in absorption of N=C=O stretching vibration (2280 cm⁻¹) of isocyanate and an increase in absorption of N=C=N stretching vibration (2140 cm⁻¹) of carbodiimide were observed. An end point of the reaction was confirmed by the IR measurement and a reaction solution was cooled down to the room temperature, whereby a polycarbodiimide solution was obtained.

Subsequently, the polycarbodiimide solution was applied on a separator (thickness 50 μm) (manufactured by Toray Industries, Inc.) of a polyethylene terephthalate film treated by a release agent (silicone fluoride). The polycarbodiimide solution was heated at 130° C. for one minute and, then, heated at 150° C. for one minute and the separator was removed to manufacture a preliminarily cured sheet-like polycarbodiimide layer (length 30 mm×width 30 mm, thickness 50 μm).

Example 1

The sheet-like epoxy resin layer was heated and pressed on a wiring circuit board mounted with the optical semiconductor element at 140° C. and 0.1 MPa for sixty seconds using the press plate A by a vacuum laminator (manufactured by Nichigo-Morton Co., Ltd.). Thereafter, the epoxy resin was cured at 160° C. for sixteen hours to seal the optical semiconductor element.

Subsequently, sections other than a light reflecting section (a circle with a radius of 1 mm) were masked and sputtered, whereby a thin film of silver with a thickness of 1 μm was formed on an upper surface of the light reflecting section to manufacture a direct-type backlight with a thickness of 800 μm.

Example 2

Three sheet-like polycarbodiimide layers with a thickness of 50 μm were laminated to manufacture a polycarbodiimide layer of length 30 mm×width 30 mm×thickness 150 μm. Subsequently, this polycarbodiimide layer was heated and pressed on a wiring circuit board, which is mounted with the optical semiconductor element, at 150° C. and 0.1 MPa for sixty seconds using a press plate, in which a dome-like recess with a curvature radius of 0.6 mm and a height of 0.12 mm is formed in a portion corresponding to a position of an optical semiconductor element, by a vacuum laminator (manufactured by Nichigo-Morton Co., Ltd.). Thereafter, the polycarbodiimide was cured at 150° C. for one hour to seal the optical semiconductor element.

Subsequently, the sheet-like epoxy resin layer was heated and pressed on the polycarbodiimide layer at 140° C. and 0.1

MPa for sixty seconds using the press plate A by the vacuum laminator (manufactured by Nichigo-Morton Co., Ltd.). Thereafter, the epoxy resin was cured at 160° C. for sixteen hours to seal the optical semiconductor element and manufacture a direct-type backlight with a thickness of 950 μm.

Example 3

A circular hole, which is a size lager than an optical semiconductor element, was formed in a position corresponding to the optical semiconductor element of the sheet-like polycarbodiimide layer with a thickness of 50 μm using a punching machine. The polycarbodiimide layer was placed on a wiring circuit board mounted with the optical semiconductor element such that the optical semiconductor element was inside the hole of the polycarbodiimide layer. The polycarbodiimide layer was heated and pressed at 150° C. and 0.1 MPa for sixty seconds using the press plate C by a vacuum laminator (manufactured by Nichigo-Morton Co., Ltd.). Thereafter, the polycarbodiimide was cured at 150° C. for one hour.

Subsequently, the sheet-like epoxy resin layer was heated and pressed on the polycarbodiimide layer at 140° C. and 0.1 MPa for sixty seconds using the press plate B by the vacuum laminator (manufactured by Nichigo-Morton Co., Ltd.). Thereafter, the epoxy resin was cured at 160° C. for sixteen hours to seal the optical semiconductor element and manufacture a direct-type backlight with a thickness of 850 μm. In the case of this embodiment, since the epoxy resin layer is formed along a projection formed on the polycarbodiimide layer, light scattering grooves are formed relatively in a lower surface of the epoxy resin layer.

Comparative Example 1

A direct-type backlight was manufactured in the same manner as the first embodiment except that the press plate B was used as a press plate.

Comparative Example 2

A light reflecting section and light scattering grooves having shapes shown below were formed on a polyimide sheet by laser machining and a nickel thin film was formed by nickel plating to make a machined surface thereof smooth. Press plate D was prepared by transferring the obtained nickel thin film.

Shape of the Light Reflecting Section

An unevenness of a semispherical shape with a radius of 20 μm, a height of 25 μm, and a pitch of 60 μm in a circle having a radius of 3 mm with a position corresponding to a center of gravity of an optical semiconductor element as a center Shape of the Light Scattering Grooves A radius of a circle in the center: 6.7 mm
The number of concentric circles: 10
Intervals among the concentric circles: 1.45 mm (for all the intervals) (i.e., a radius of a tenth circle is 19.75 mm)
A shape of grooves: width of 30 μm, depth of 17 μm, a sectional shape of a right triangle (θ of 30 degrees, the hypotenuse of the right triangle corresponds to the surface 5a)

A direct-type backlight was manufactured in the same manner as the first embodiment except that the press plate D prepared in the above description was used as a press plate.

Evaluation of Uniformity of Light Emission in a Plane

Figure 4:
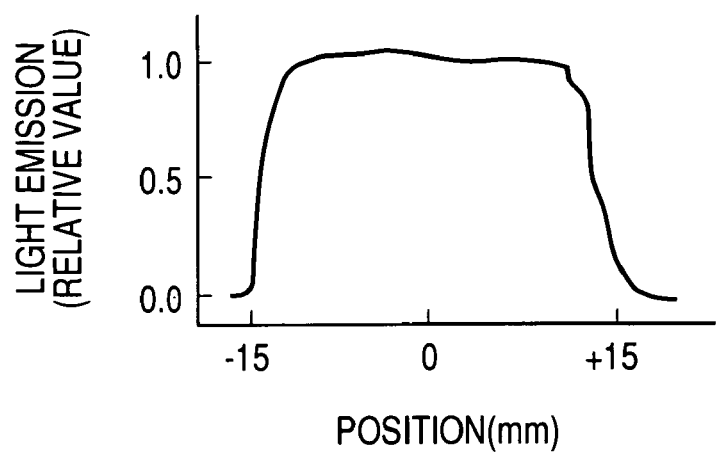
FIG. 4 shows a result of measuring light emission of the direct-type backlight of the present invention with a multi-channel photo-detector.
Figure 5:
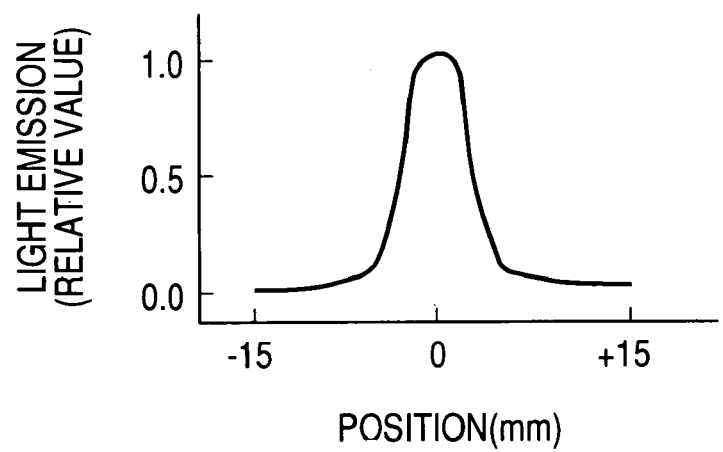
FIG. 5 shows a result of measuring light emission of a direct-type backlight obtained in a comparative example with a multi-channel photo-detector.
Figure 6:
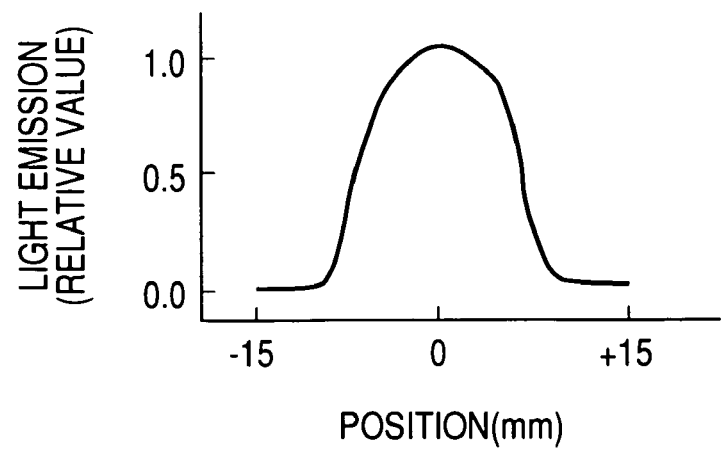
FIG. 6 shows a result of measuring light emission of a direct-type backlight obtained in a comparative example with a multi-channel photo-detector.

Uniformity of light emission of the direct-type backlights prepared in Examples 1 to 3 and Comparative Examples 1 and 2 were measured with a multi-channel photo-detector (manufactured by Otsuka Electronics Co., Ltd.; MCPD3000). A result of the direct-type backlight manufactured in Example 1 is shown in FIG. 4, a result of the direct-type backlight manufactured in Comparative Examples 1 is shown in FIG. 5, and a result of the direct-type backlight manufactured in Comparative Example 2 is shown in FIG. 6.

As a result, it is seen that, in the direct-type backlight manufactured Example 1, a uniform amount of light emission is obtained in a width direction in a plane. In addition, the same results were obtained in Examples 2 and 3. On the other hand, it is seen that, in the direct-type backlight manufactured in Comparative Example 1, since light emission concentrates near the optical semiconductor element, uniform light emission is not obtained. Moreover, it is seen that, in Comparative Example 2, since light emission in an area at a radius of about 8 mm from the center (a light source section) is intense, uniform light emission is not obtained.

In view of above, it is seen that it is possible to provide a direct-type backlight in which an amount of light emission is uniform in a plane by the present invention.

Furthermore, it is possible to use the direct-type backlight of the present invention in a backlight for a liquid crystal display.

While the present invention has been described in detail and with reference to specific embodiments thereof, it will be apparent to one skilled in the art that various changes and modifications can be made therein without departing the spirit and scope thereof.

The present application is based on Japanese Patent Application No. 2004-126077 filed on Apr. 21, 2004, and the contents thereof are incorporated herein by reference.

What is claimed is:

1. A direct-type backlight comprising:
   a resin sealing member comprising:
      at least one resin layer comprising a light reflecting section disposed in an outermost surface of the resin sealing member;
   an optical semiconductor element sealed by the resin sealing member; and
   a plurality of circular light scattering grooves formed concentrically in at least one surface of the resin layer,
   wherein an area of a circle having as a circumference, the innermost groove of the plurality of light scattering grooves, and the area of each of the spaces between each of the plurality of light scattering grooves are equal.

2. The direct-type backlight according to claim 1, wherein a cross-sectional shape of at least one of the plurality of light scattering grooves is a triangle.

3. The direct-type backlight according to claim 2, wherein the triangle is a right triangle.

4. The direct-type backlight according to claim 1, wherein a width of each of the plurality of light scattering grooves is 1 to 100 μm.

5. The direct-type backlight according to claim 1, wherein a depth of each of the plurality of light scattering grooves is 0.5 to 120 μm.

6. The direct-type backlight according to claim 1, wherein the resin sealing member has a thickness of from 0.1 to 1 mm.

7. The direct-type backlight according to claim 1, wherein the sealing member further comprises a reflective surface disposed on a side surface thereof.

8. The direct-type backlight according to claim 1, wherein the light reflecting section is disposed above the optical semiconductor element.

9. The direct-type backlight according to claim 1, wherein the light reflecting section comprises fine unevenness.

10. The direct-type backlight according to claim 1, wherein a metal thin film is disposed on the light reflecting section.

11. The direct-type backlight according to claim 1, wherein the at least one resin layer includes plural resin layers,
wherein each of the plural resin layers has a different refractive index.

12. The direct-type backlight according to claim 11, wherein the plural resin layers comprise an outermost layer and an innermost layer that the optical semiconductor element is disposed on,
wherein the plural resin layers are arranged such that a refractive index of the plural resin layers decreases sequentially from the innermost layer, on which the optical semiconductor is disposed, to the outermost layer.

13. A lighting device comprising:

a direct-type backlight comprising:

a resin sealing member comprising:

at least one resin layer comprising a light reflecting section disposed in an outermost surface of the resin sealing member;

an optical semiconductor element sealed by the resin sealing member; and a plurality of circular light scattering grooves formed concentrically in at least one surface of the resin layer, wherein an area of a circle having as a circumference, the innermost groove of the plurality of light scattering grooves, and the area of each of the spaces between each of the plurality of light scattering grooves are equal; and a circuit board.

* * * * *